(12) United States Patent
Nakamura et al.

(10) Patent No.: US 8,092,696 B2
(45) Date of Patent: Jan. 10, 2012

(54) METHOD FOR MANUFACTURING PRINTED CIRCUIT BOARD

(75) Inventors: Kei Nakamura, Ibaraki (JP); Takeshi Yamato, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 1047 days.

(21) Appl. No.: 11/955,432

(22) Filed: Dec. 13, 2007

(65) Prior Publication Data

US 2008/0164236 A1 Jul. 10, 2008

Related U.S. Application Data

(62) Division of application No. 11/173,126, filed on Jul. 1, 2005, now abandoned.

(30) Foreign Application Priority Data

Jul. 1, 2004 (JP) ................................. 2004-195939

(51) Int. Cl.
  *H01B 13/00* (2006.01)
(52) U.S. Cl. ............ 216/16; 216/13; 174/255; 174/259; 174/260
(58) Field of Classification Search .................... 216/13, 216/16; 174/255, 259, 260
  See application file for complete search history.

(56) References Cited

U.S. PATENT DOCUMENTS

| | | | |
|---|---|---|---|
| 4,352,716 A * | 10/1982 | Schaible et al. | ................. 216/78 |
| 5,366,814 A | 11/1994 | Yamanishi et al. | |
| 5,437,914 A | 8/1995 | Saida et al. | |
| 5,679,230 A | 10/1997 | Fatcheric et al. | |
| 5,858,518 A * | 1/1999 | Omote et al. | ................. 428/209 |
| 6,278,185 B1 | 8/2001 | Murali et al. | |
| 6,319,620 B1 | 11/2001 | Kataoka et al. | |
| 6,689,268 B2 | 2/2004 | Chen et al. | |

(Continued)

FOREIGN PATENT DOCUMENTS

DE 41 13 261 A1 10/1992

(Continued)

OTHER PUBLICATIONS

Byung-Nam Park et al.; Film Properties of Copper Grown by the Electroplating Process; Journal fo the Korean Physical Society; vol. 38, No. 3: Mar. 2001; pp. 232-235.

(Continued)

*Primary Examiner* — Nadine G Norton
*Assistant Examiner* — Mahmoud Dahimene
(74) *Attorney, Agent, or Firm* — Panitch Schwarze Belisario & Nadel LLP (57) ABSTRACT

An insulating layer made of an insulator film or the like is prepared. Then, a thin metal film and a thin copper film are formed in sequence on the insulating layer. The thin copper film is subsequently laminated with a dry film or the like, and exposed and developed to form a plating resist thereon that have patterns opposite to conductor patterns which are formed in a subsequent step. This is followed by forming conductor patterns made of copper, by electrolytic plating using an electrolytic copper sulfate plating solution, on the surfaces of the thin copper film where the plating resist is not formed. The plating resist is then removed by, for example, stripping. After this, the thin copper film is held at a temperature of not less than 200° C. and not more than 300° C. for approximately an hour to be thermally treated. Then, the thin copper film and the thin metal film are removed by chemical etching except the portions under the conductor patterns.

7 Claims, 5 Drawing Sheets

U.S. PATENT DOCUMENTS

| | | | |
|---|---|---|---|
| 2002/0009883 A1* | 1/2002 | Ogure et al. | 438/676 |
| 2002/0056192 A1 | 5/2002 | Suwa et al. | |
| 2002/0171151 A1 | 11/2002 | Andricacos et al. | |

FOREIGN PATENT DOCUMENTS

| | | |
|---|---|---|
| EP | 0 257 737 A2 | 3/1988 |
| EP | 0 337 465 A2 | 10/1989 |
| EP | 0 616 489 A1 | 9/1994 |
| EP | 1 476 004 A2 | 11/2004 |
| JP | 06-120630 A | 4/1994 |
| JP | 07-032544 A | 2/1995 |
| JP | 09-051163 A | 2/1997 |
| JP | 2002-176259 A | 6/2002 |
| JP | 2003-318532 A | 11/2003 |
| JP | 2003-324258 A | 11/2003 |
| JP | 2004-039771 A | 2/2004 |
| JP | 2004082444 A | 3/2004 |
| TW | 587103 B | 5/2004 |

OTHER PUBLICATIONS

Rocky Hilburn et al.; The State of Copper, Printed Circuit Design & Manufacture; May 2005; pp. 24-29.

Office Action issued Sep. 23, 2011 in TW Patent Application No. 094121651.

Office Action issued Sep. 8, 2011 in KR Patent Application No. 10-2005-0057589.

* cited by examiner

PRIOR ART

METHOD FOR MANUFACTURING PRINTED CIRCUIT BOARD

CROSS-REFERENCE TO RELATED APPLICATIONS

This application is a Division of U.S. patent application Ser. No. 11/173,126, filed Jul. 1, 2005, which was published in the English language on Jan. 5, 2006, under U.S. Patent Application Publication No. US 2006/0000637 A1 and the disclosure of which is incorporated herein by reference.

BACKGROUND OF THE INVENTION

The present invention relates to printed circuit boards and a method for manufacturing such printed circuit boards.

Printed circuit boards such as flexible printed circuit boards are widely used in a variety of electrical and electronic devices. A printed circuit board includes, for example, an insulating layer of, e.g., polyimide, having on one side or both sides thereof conductor layers of, e.g., a copper foil with prescribed patterns.

Conventionally, conductor layers having prescribed patterns in printed circuit boards such as flexible printed circuit boards are formed by the known methods such as the semi-additive, substractive, and full-additive methods (refer to JP 2002-176259, for example).

The above-mentioned semiadditive method is now described with reference to the drawings.

Figure 4:
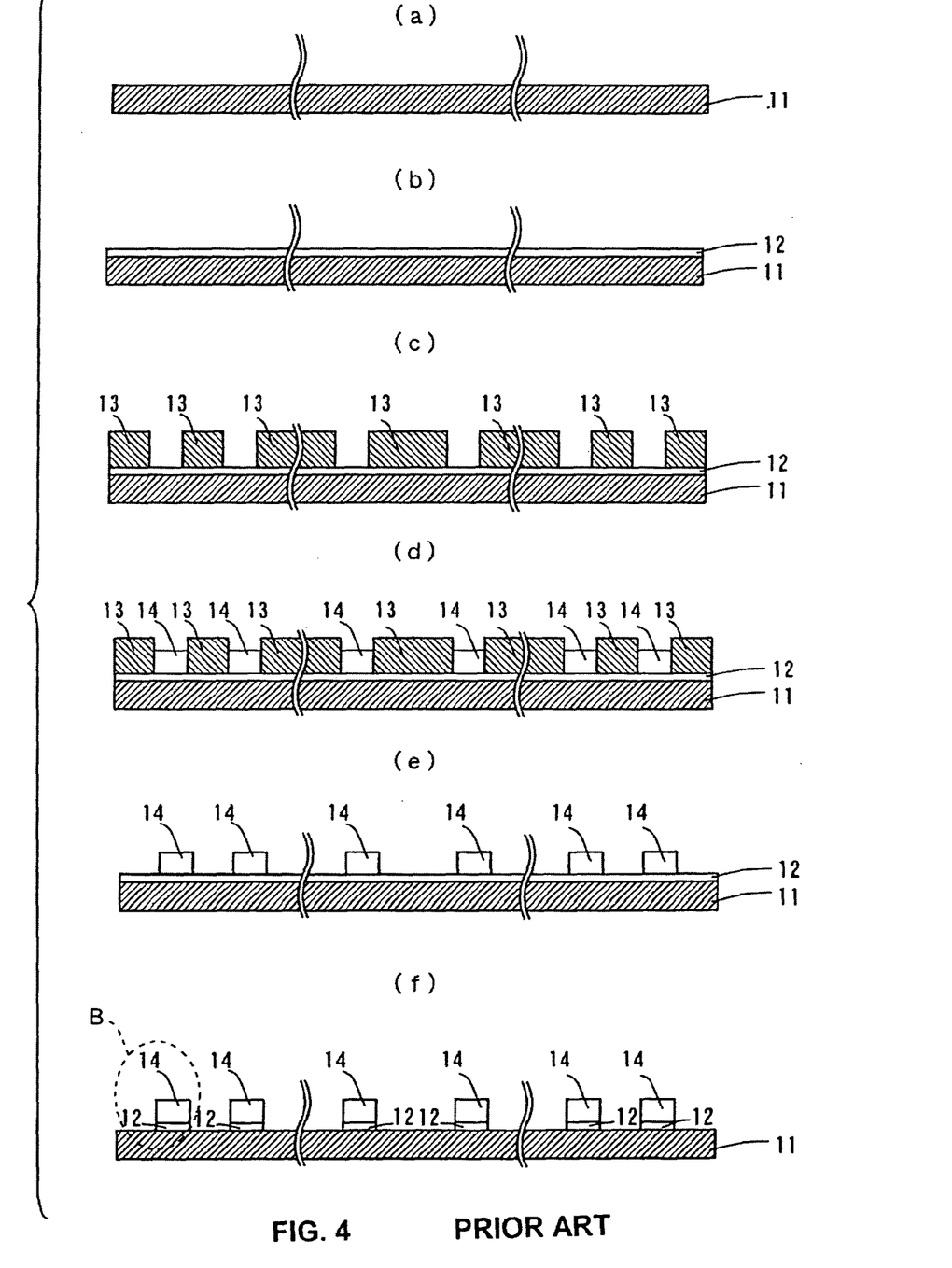

FIGS. 4 (a), 4 (b), 4 (c), 4 (d), 4 (e), and 4 (f) are schematic cross sectional views showing the steps of a method for manufacturing a printed circuit board by the semiadditive method.

In the semi-additive method, for example, an insulating layer 11 of a resin film is first prepared, as shown in FIG. 4 (a).

Next, as shown in FIG. 4 (b), a thin conductive film 12 is formed on the insulating layer 11 by sputtering or electroless plating.

Then, as shown in FIG. 4 (c), a plating resist 13 is formed on the thin conductive film 12 using a dry film resist or the like. The plating resist 13 has patterns opposite to the prescribed patterns of a conductor layer formed in a step shown below.

After this, as shown in FIG. 4 (d), a conductor layer 14 is formed by electrolytic plating on the surfaces of the thin conductive film 12 where the plating resist 13 is not formed.

This is followed by removing the plating resist 13 by, e.g., stripping, as shown in FIG. 4 (e). Then, the thin conductive film 12 except the portions on which the conductor layer 14 is formed is removed by chemical etching or the like, as shown in FIG. 4 (f). In this manner, the conductor layer 14 with prescribed patters is formed on the insulating layer 11.

However, in the conventional method for forming a printed circuit board, side etching of the thin conductive film 12 under the conductor layer 14 may occur during the removal of the thin conductive film 12 except the portions under the conductor layer 14 by chemical etching or the like. The term "side etching" is described now with reference to the figure below.

Figure 5:
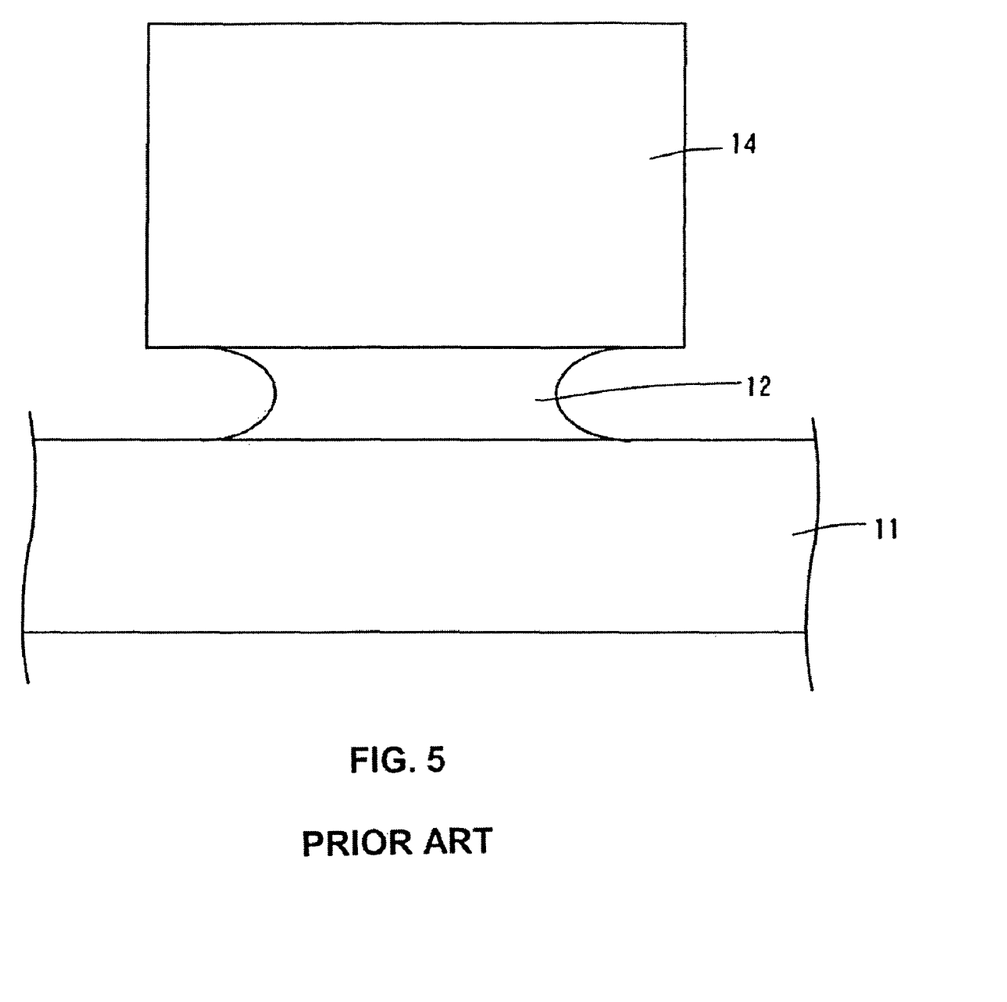
FIG. 5 is a magnified view of the region B in FIG. 4 (*f*).

FIG. 5 is a magnified view of the region B in FIG. 4 (f). During the removal of the thin conductive film 12 by chemical etching or the like, the thin conductive film 12 under the conductor layer 14 was etched together with both ends thereof being gouged as shown in FIG. 5. This results in a deterioration of the adhesion of the conductor layer 14 to the thin conductive film 12. In the case of a significant decrease in the adhesion, the conductor layer 14 may be stripped off.

BRIEF SUMMARY OF THE INVENTION

It is an object of the present invention to provide printed circuit boards that provide improved adhesion of conductor layers and a method for manufacturing such printed circuit boards.

A printed circuit board according to one aspect of the invention comprises, in sequence, an insulating layer, a thin copper film, and a conductor layer, wherein the conductor layer and the thin copper film have prescribed patterns, and the thin copper film has a first surface in contact with the insulating layer and a second surface in contact with the conductor layer, and contains a grain of a size that extends between the first surface and the second surface.

In the printed circuit board, the thin copper film and conductor layer with the prescribed patterns are formed in sequence on the insulating layer. The thin copper film contains a grain of a size that extends between the first surface in contact with the insulating layer and the second surface in contact with the conductor layer. This reduces or prevents the incidence of side etching of the thin copper film under the conductor layer during the removal of the thin copper film except the portions on which the conductor layer is formed. In this manner, a sufficient adhesion area of the thin copper film to the insulating layer is ensured to improve the adhesion.

The thin copper film preferably has a thickness of not less than 50 nm and not more than 300 nm. This further improves the adhesion of the conductor layer to the thin copper film.

The conductor layer may include copper. This even further improves the adhesion of the conductor layer to the thin copper film.

The printed circuit board may further comprise a thin metal film between the insulating layer and the thin copper film. In this manner, a sufficient adhesion area of the thin copper film to the thin metal film is ensured to improve the adhesion.

The thin metal film may include at least one of chromium and nickel. This further improves the adhesion between the insulating layer and the thin copper film.

The thin metal film preferably has a thickness of not less than 5 nm and not more than 50 nm. This still further improves the adhesion between the insulating layer and the thin copper film.

The insulating layer may include a flexible substrate. The flexible substrate having flexibility allows the flexibility of the printed circuit board to be improved.

A method for manufacturing a printed circuit board by a semi-additive method according to another aspect of the invention comprises the steps of forming a thin copper film on an insulating layer, forming a conductor layer having prescribed patterns on the thin copper film, removing the thin copper film except portions on which the conductor layer is formed, and applying a thermal treatment to the thin copper film between the step of forming the thin copper film and the step of forming the conductor layer or between the step of forming the conductor layer and the step of removing the thin copper film.

In the method for manufacturing the printed circuit board, the thin copper film is thermally treated between the step of forming the thin copper film and the step of forming the conductor layer or between the step of forming the conductor layer and the step of removing the thin copper film, which increases the size of grains contained in the thin copper film. This reduces or prevents the incidence of side etching of the thin copper film under the conductor layer during the removal of the thin copper film except the portions on which the conductor layer is formed. Thus, a sufficient adhesion area of the thin copper film to the insulating layer is ensured to improve the adhesion. In addition, where a thin metal film is present between the insulating layer and the thin copper film, a sufficient adhesion area of the thin copper film to the thin metal film is ensured to improve the adhesion.

A temperature during the thermal treatment of the thin copper film may be not less than 200° C. and not more than 300° C. This allows the size of grains contained in the thin copper film to be sufficiently increased.

The method for manufacturing a printed circuit board may include the steps of forming a resist on the thin copper film that has patterns opposite to the prescribed patterns, forming a conductor layer on the thin copper film except portions on which the resist is formed, and removing the resist after forming the conductor layer, and wherein the step of applying the thermal treatment to the thin copper film is provided between the step of forming the thin copper film and the step of forming the resist or between the step of removing the resist and the step of removing the thin copper film.

In this manner, the step of applying the thermal treatment to the thin copper film is provided between the step of forming the thin copper film and the step of forming the resist or between the step of removing the resist and the step of removing the thin copper film. This prevents the resist from dissolving by the thermal treatment of the thin copper film.

The manufacturing method may further comprise the step of forming a thin metal film between the insulating film and the thin copper film. In this manner, a sufficient adhesion area of the thin copper film to the thin metal film is ensured to improve the adhesion.

The step of forming the thin metal film may include the step of forming at least one of chromium and nickel as the thin metal film. This further improves the adhesion between the insulating layer and the thin copper film.

The step of forming the thin metal film may include the step of forming the thin metal film having a thickness of not less than 5 nm and not more than 50 nm. This still further improves the adhesion between the insulating layer and the thin copper film.

The step of forming the thin copper film on the insulating layer may include the step of forming the thin copper film on a flexible substrate that serves as the insulating layer. The flexible substrate having flexibility allows the flexibility of the printed circuit board to be improved.

According to the invention, the thin copper film contains a grain of the size that extends between the first surface in contact with the insulating layer and the second surface in contact with the conductor layer. This reduces or prevents the incidence of side etching of the thin copper film under the conductor layer during the removal of the thin copper film except the portions on which the conductor layer is formed. In this manner, a sufficient adhesion area of the thin copper film to the insulating layer is ensured to improve the adhesion. In addition, where the thin metal film is present between the insulating layer and the thin copper film, a sufficient adhesion area of the thin copper film to the thin metal film is ensured to improve the adhesion.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings:

FIGS. 1 (*a*), 1 (*b*), 1 (*c*), and 1 (*d*) are schematic cross sectional views showing the steps of a method for manufacturing a printed circuit board according to an embodiment of the invention;

FIGS. 2 (*e*), 2 (*f*), and 2 (*g*) are schematic cross sectional views showing the steps of a method for manufacturing a printed circuit board according to an embodiment of the invention;

FIGS. 4 (*a*), 4 (*b*), 4 (*c*), 4 (*d*), 4 (*e*), and 4 (*f*) are schematic cross sectional views showing the steps of a method for manufacturing a printed circuit board by the semiadditive method.

DETAILED DESCRIPTION OF THE INVENTION

A printed circuit board according to an embodiment of the invention and a method for manufacturing the printed circuit board will be described below with reference to the drawings.

Figure 1:
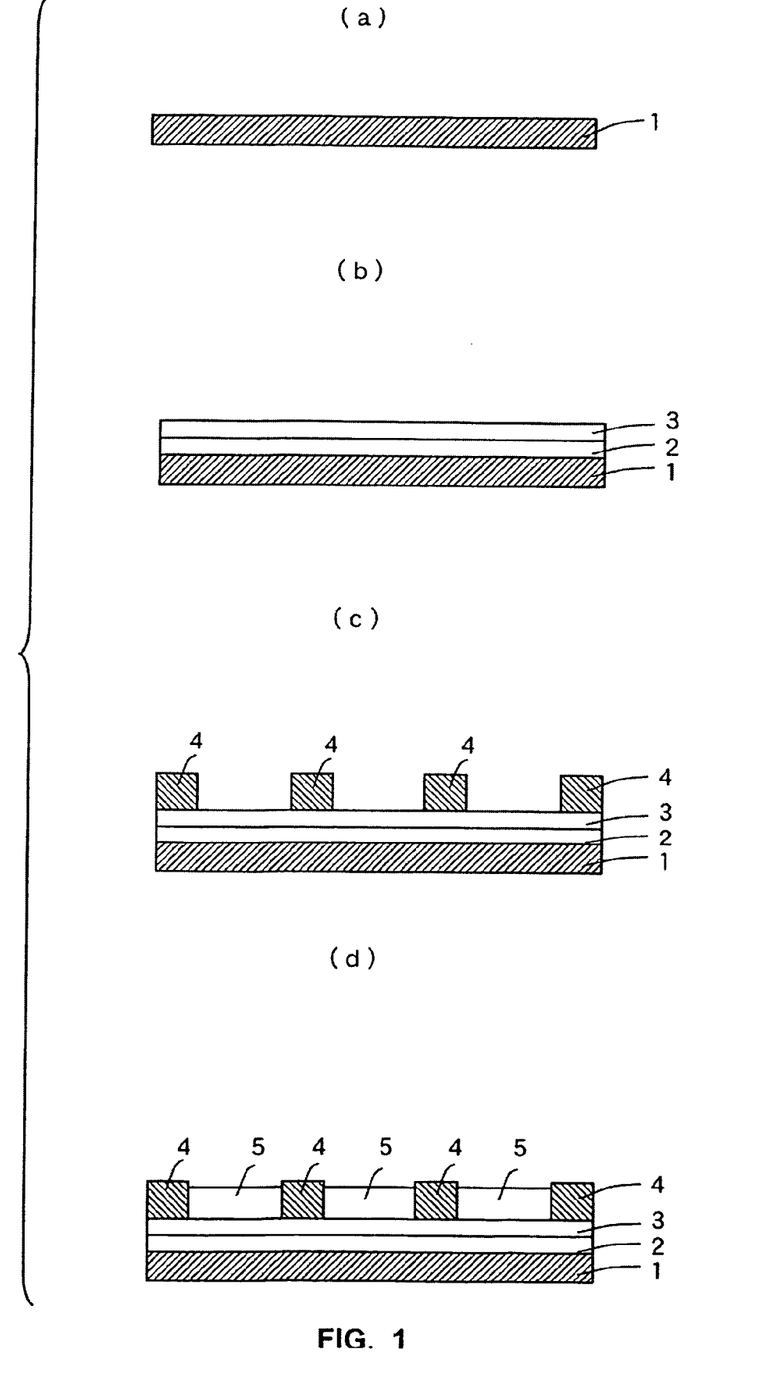

A method for manufacturing a printed circuit board according to an embodiment will be described first. FIGS. 1 (*a*), 1 (*b*), 1 (*c*), and 1 (*d*) as well as FIGS. 2 (*e*), 2 (*f*), and 2 (*g*) are schematic cross sectional views showing the steps of a method for manufacturing a printed circuit board according to an embodiment of the invention.

To begin with, as shown in FIG. 1 (*a*), an insulating layer 1 made of, e.g., an insulator film, is prepared. Such an insulator film is made of polyimide or polyester, for example. Alternatively, the insulating layer 1 may be formed by applying a resin onto a substrate made of a metal foil.

Next, a thin metal film 2 and a thin copper film 3 are formed in sequence on the insulating layer 1, as shown in FIG. 1 (*b*). The thin metal film 2, which is provided to improve the adhesion between the insulating layer 1 and the thin copper film 3, may only be provided when necessary. Each of the thin metal film 2 and thin copper film 3 is formed by sputtering, electroless plating, or other suitable means.

The thin metal film 2 as used here includes at least either of chromium and nickel. For example, the thin metal film 2 may be made of a single layer of chromium, a laminated film of chromium and nickel, or a film of a chromium-nickel alloy. The thickness of the thin metal film 2 is preferably in the range of not less than 5 nm and not more than 50 nm, for example. This further improves the adhesion of the thin copper film 3 to the insulating layer 1.

The thickness of the thin copper film 3 is preferably in the range of not less than 50 nm and not more than 300 nm, for example. This further improves the adhesion of conductor patterns 5 described below to the thin copper film 3.

Then, as shown in FIG. 1 (*c*), the thin copper film 3 is laminated with, e.g., a dry film, and exposed and developed to form plating resist 4 thereon. The plating resist 4 have patterns opposite to the conductor patterns 5 which are formed in a step shown below.

After this, as shown in FIG. 1 (*d*), the conductor patterns 5 are formed on the surfaces of the thin copper film 3 where the plating resist 4 is not formed by electrolytic plating using, e.g., a copper sulfate electrolytic plating solution. A metal or an alloy other than copper may also be used as the material of the conductor patterns 5.

Figure 2:
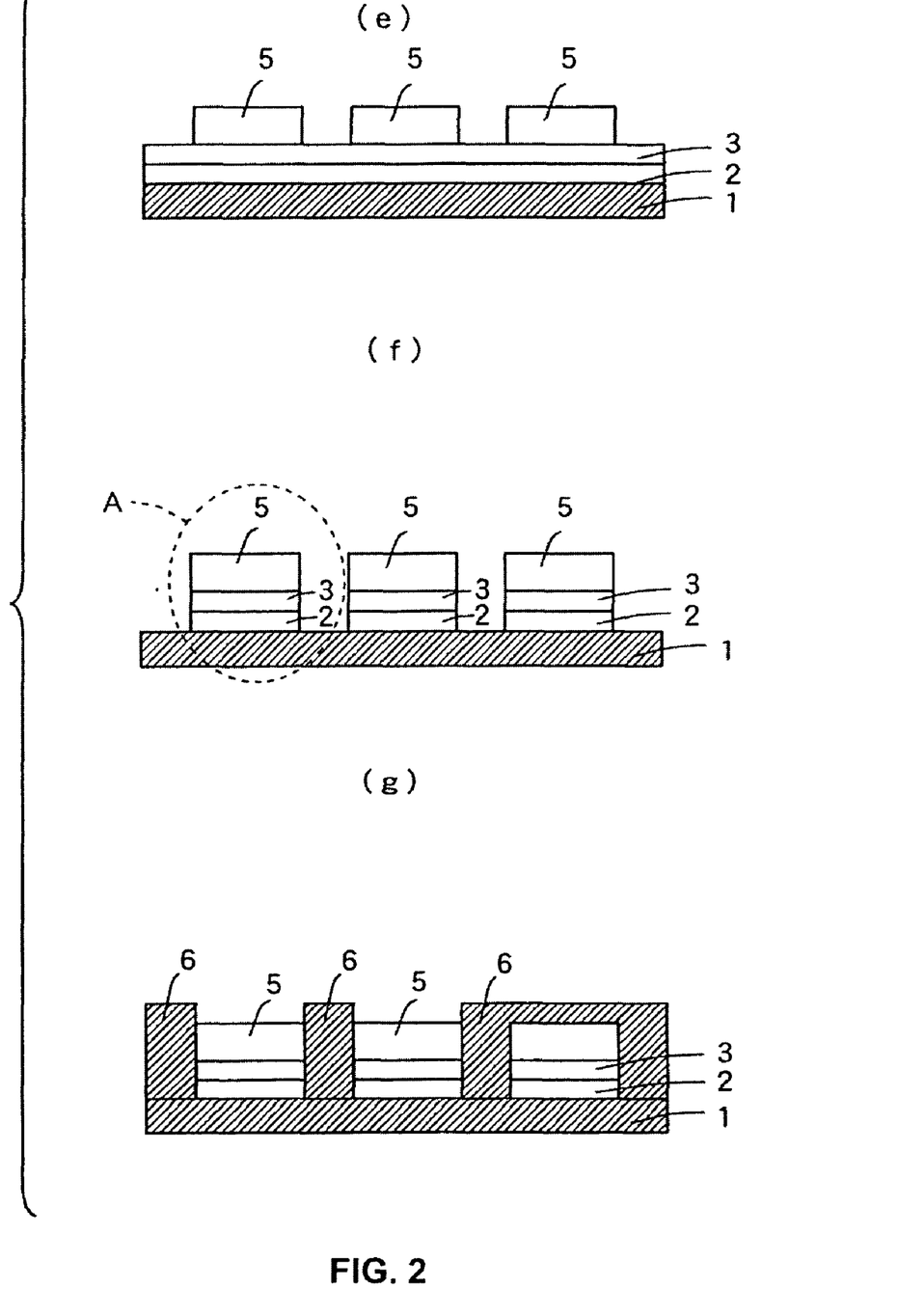

The plating resist 4 is subsequently removed by, for example, stripping, as shown in FIG. 2 (*e*). Then, a thermal treatment is applied to the thin copper film 3. During the thermal treatment, the thin copper film 3 is held at a temperature of not less than 200° C. and not more then 300° for approximately an hour, preferably not less than half an hour and not more than two hours. Setting the time to not less than half an hour and not more than two hours as described above allows the grain size to be sufficiently increased while preventing consumption of an excessive energy.

The above-described thermal treatment allows the grain size of the thin copper film 3 to be increased. For example, in this embodiment, the grain size of the thin copper film 3 is as large as approximately not less than 40 nm and not more than 300 nm.

After this, as shown in FIG. 2 (f), the thin copper film 3 and thin metal film 2 are removed, by chemical etching using, e.g., a mixed solution of a sulfuric acid and oxygenated water, except the portions on which the conductor patterns 5 are formed.

Then, as shown in FIG. 2 (g), a protective insulating layer 6 of polyimide or the like having prescribed patterns is formed. In this case, a terminal is provided on the portion of each conductor pattern 5 that is not covered with the protective insulating layer 6 (i.e., an aperture).

Note that the above-described thermal treatment is possible without a plating resist being formed. For example, the thermal treatment may be performed between the step of FIG. 1 (b) and the step of FIG. 1 (c).

Figure 3:
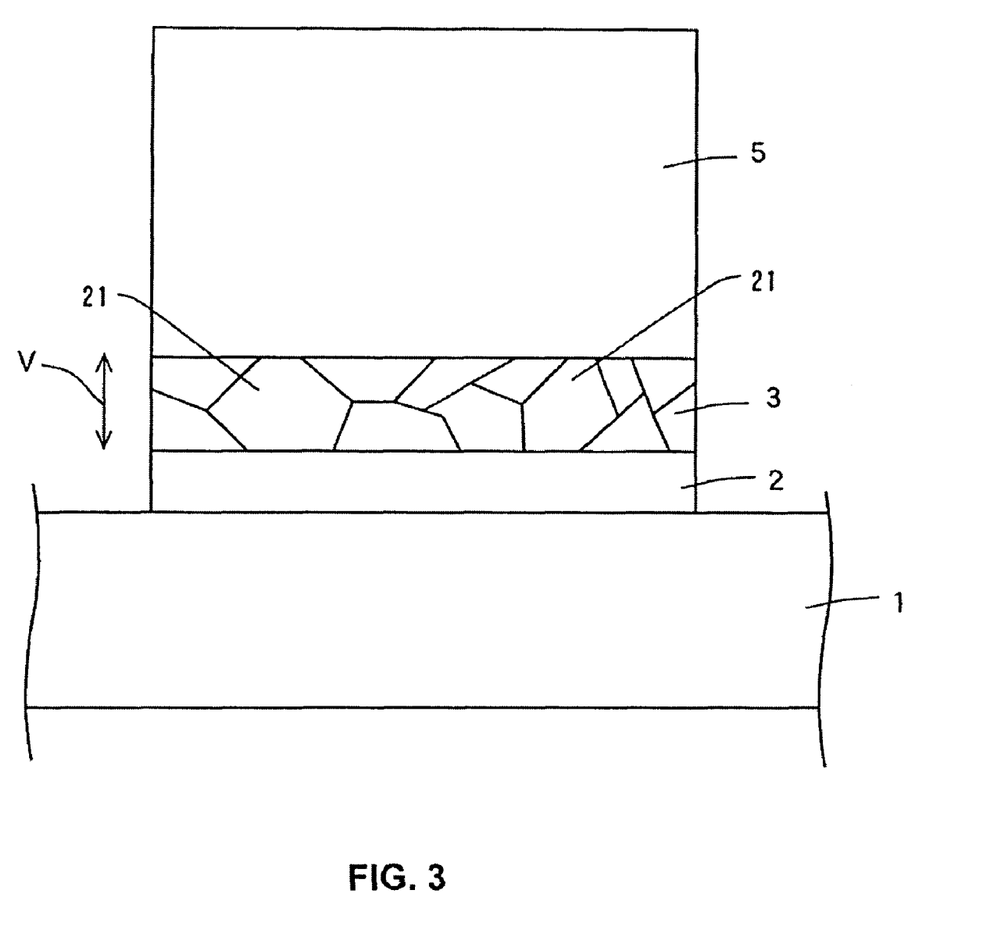
FIG. 3 is a magnified view of the region A in FIG. 2 (*f*)

Now, advantageous effects provided by the above-described thermal treatment of the thin copper film 3 will be described. FIG. 3 is a magnified view of the region A in FIG. 2 (f). As shown in FIG. 3, thermally treating the thin copper layer 3 allows the size of grains contained in the thin copper layer 3 to be increased.

That is, in this embodiment, the thermally treated thin copper film 3 contains a grain 21 of such size as to extend between one surface of the thin copper film 3 in contact with the insulating layer 1 and the other surface of the thin copper film 3 in contact with the conductor pattern 5. That is, the thin copper film 3 has a point where only a single grain 21 is present in the thickness direction V. This reduces or prevents the incidence of side etching of the thin copper film 3 under the conductor pattern 5 during the removal of the thin copper film 3 except the portion on which the conductor pattern 5 is formed. This ensures a sufficient adhesion area of the thin copper film 3 to the insulating layer 1 to improve the adhesion. Where the thin metal film 2 is present between the insulating layer 1 and the thin copper film 3, a sufficient adhesion area of the thin copper film 2 to the thin metal film 2 is ensured to improve the adhesion.

Although in this embodiment, the use of polyimide, polyester, or the like as the material of the insulating layer 1 is described, any other highly insulating films of plastics may also be used as the insulating layer 1. For example, a polyethylene terephthalate film, a polyethylene naphthalate film, a polyether nitril film, polyethersulfone film, a polyvinyl chloride film or the like may be used.

It is preferred to use, in particular, a polyimide film, a polyethylene terephthalate film, or a polyethylene naphthalate film, since they are superior in such properties as thermal resistance, dimensional stability, electrical properties, mechanical properties, and chemical resistant properties.

Examples

Inventive Example

A printed circuit board according to Inventive Example and the method for manufacturing the printed circuit board will be described below. The manufacturing method according to Inventive Example is based upon the manufacturing method according to the above-described embodiment, and therefore the description of drawings is omitted.

First, an insulating layer 1 made of a 25-μm polyimide insulator film was prepared.

Next, a thin metal film 2 made of 30-nm nichrome and a 200-nm thin copper film 3 were formed in sequence on the insulating layer 1 by sputtering.

Then, the thin copper film 3 was laminated with a dry film, and then exposed and developed to form a plating resist 4 thereon having patterns opposite to conductor patterns that are formed in a step shown below.

After this, conductor patterns 5 of copper with a thickness of 8 μm, a width of 15 μm, and a pitch of 15 μm were formed, by electrolytic plating using a copper sulfate electrolytic plating solution, on the surfaces of the thin copper film 3 where the plating resist 4 was not formed.

The plating resist 4 was then stripped off, after which the thin copper film 3 was held at 250° C. for an hour to be thermally treated.

Then, the thin copper film 3 and thin metal film 2 were removed except the portions under the conductor patterns 5 by chemical etching using a mixed solution of a sulfuric acid/oxygenated water. This was followed by the formation of a protective insulating film 6 of polyimide having prescribed patterns.

A cross section of thus fabricated printed circuit board was observed with a scanning electron microscope (SEM).

The results showed that the thin copper film 3 contained grains of the size equal to the thickness of the thin copper film 3, 200 nm; i.e., grains of such size as to extend between one surface of the thin copper film 3 in contact with the thin metal film 2 and the other surface of the thin copper film 3 in contact with the conductor patterns 5 in the thickness direction V.

In addition, the thin copper film 3 under the conductor patterns 5 did not show any side etching.

Stripping tests using an adhesive tape were also conducted in order to check the conductor patterns 5 for adhesion to the thin copper film 3. The results confirmed that the conductor patterns 5 were not stripped at all, and possessed good adhesion.

Comparative Example

The method for manufacturing a printed circuit board according to Comparative Example differed from the above-described method according to Inventive Example in that the thin copper film 3 was not thermally treated.

After the fabrication of the printed circuit board, a cross section of the printed circuit board was observed with SEM, as in the above-described Inventive Example.

The results showed that the sizes of all of grains contained in the thin copper film 3 were less than 200 nm, and there always existed two or more grains between one surface of the thin copper film 3 in contact with the thin metal film 2 and the other surface of the thin copper film 3 in contact with the conductor patterns 5 in the thickness direction V.

Further, the thin copper film 3 under the conductor patterns 5 showed side etching.

Stripping tests using an adhesive tape were also conducted in order to check the conductor patterns 5 for adhesion to the thin copper film 3. The results confirmed that part of the conductor patterns 5 was stripped off, and did not possess good adhesion.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method for manufacturing a printed circuit board by a semi-additive method, comprising the steps of:
   forming a thin copper film on an insulating layer;
   forming a conductor layer having prescribed patterns on said thin copper film;
   removing said thin copper film except portions on which said conductor layer is formed; and
   applying a thermal treatment to said thin copper film between said step of forming said thin copper film and said step of forming said conductor layer or between said step of forming said conductor layer and said step of removing said thin copper film.

2. The method for manufacturing a printed circuit board according to claim 1, wherein a temperature during said thermal treatment of said thin copper film is not less than 200° C. and not more than 300° C.

3. The method for manufacturing a printed circuit board according to claim 1, wherein
   said step of forming said conductor layer includes the steps of:
   forming a resist on said thin copper film that has patterns opposite to said prescribed patterns;
   forming a conductor layer on said thin copper film except portions on which said resist is formed; and
   removing said resist after forming said conductor layer, and wherein
   said step of applying said thermal treatment to said thin copper film is provided between said step of forming said thin copper film and said step of forming said resist or between said step of removing said resist and said step of removing said thin copper film.

4. The method for manufacturing a printed circuit board according to claim 1, further comprising the step of forming a thin metal film between said insulating film and said thin copper film.

5. The method for manufacturing a printed circuit board according to claim 4, wherein
   said step of forming said thin metal film includes the step of forming at least one of chromium and nickel as said thin metal film.

6. The method for manufacturing a printed circuit board according to claim 4, wherein
   said step of forming said thin metal film includes the step of forming said thin metal film having a thickness of not less than 5 nm and not more than 50 nm.

7. The method for manufacturing a printed circuit board according to claim 1, wherein
   said step of forming said thin copper film on said insulating layer includes the step of forming said thin copper film on a flexible substrate that serves as said insulating layer.

* * * * *